US012803246B2

(12) United States Patent
Eng et al.

(10) Patent No.: US 12,803,246 B2
(45) Date of Patent: Nov. 17, 2026

(54) SEMICONDUCTOR LASER ASSEMBLY WITH THIN FILM LITHIUM COMPOUND WAVEGUIDE

(71) Applicant: II-VI Delaware, Inc., Wilmington, DE (US)

(72) Inventors: Julie S. Eng, Los Altos, CA (US); Christopher P. Kocot, Redwood City, CA (US); Anna Tatarczak, Felton, CA (US)

(73) Assignee: II-VI Delaware, Inc., Wilmington, DE (US)

( * ) Notice: Subject to any disclaimer, the term of this patent is extended or adjusted under 35 U.S.C. 154(b) by 610 days.

(21) Appl. No.: 18/235,257

(22) Filed: Aug. 17, 2023

(65) Prior Publication Data

US 2025/0062597 A1 Feb. 20, 2025

(51) Int. Cl.

| | |
|---|---|
| ***H01S 5/20*** | (2006.01) |
| ***H01S 5/00*** | (2006.01) |
| ***H01S 5/323*** | (2006.01) |
| ***H01S 5/40*** | (2006.01) |
| ***H01S 5/42*** | (2006.01) |

(52) U.S. Cl.

CPC .......... *H01S 5/2031* (2013.01); *H01S 5/0092* (2013.01); *H01S 5/3235* (2013.01); *H01S 5/4087* (2013.01); *H01S 5/423* (2013.01)

(58) Field of Classification Search

CPC ... H01S 5/42–426; H01S 5/4087–4093; H01S 5/026–0268; H01S 5/0092; H01S 5/18–187

See application file for complete search history.

(56) References Cited

U.S. PATENT DOCUMENTS

| | | | | | |
|---|---|---|---|---|---|
| 5,408,110 | A * | 4/1995 | Janz | G02F 1/37 | 257/97 |
| 5,627,853 | A * | 5/1997 | Mooradian | H01S 5/041 | 372/18 |
| 5,982,802 | A * | 11/1999 | Thony | H01S 3/0627 | 372/75 |
| 6,404,797 | B1 | 6/2002 | Mooradian | | |
| 6,891,664 | B2 * | 5/2005 | DiJaili | H01S 5/0265 | 359/344 |
| 7,322,704 | B2 * | 1/2008 | Shchegrov | H04N 9/315 | 372/99 |
| 10,303,040 | B2 * | 5/2019 | Kirchner | G02F 1/39 | |
| 2003/0210716 | A1 * | 11/2003 | Sakata | H01S 5/06213 | 372/22 |
| 2006/0013270 | A1 * | 1/2006 | Yumoto | G02F 1/3775 | 372/21 |

(Continued)

FOREIGN PATENT DOCUMENTS

| | | | | |
|---|---|---|---|---|
| JP | 2007242667 | A * | 9/2007 | |
| JP | 2008508561 | A * | 3/2008 | H01S 5/0261 |

(Continued)

*Primary Examiner* — Joshua King
(74) *Attorney, Agent, or Firm* — TraskBritt

(57) ABSTRACT

A semiconductor laser assembly includes an array of surface emitting lasers having a light-emitting surface and an opposing surface; at least one electrical contact electrically connected to provide to the array of surface emitting lasers an electrical bias from an external electrical source; and an optical waveguide over the light-emitting surface. The optical waveguide includes lithium.

17 Claims, 7 Drawing Sheets

(56) References Cited

U.S. PATENT DOCUMENTS

| | | | | | |
|---|---|---|---|---|---|
| 2006/0023173 | A1 * | 2/2006 | Mooradian | H01S 5/423 | 348/E9.027 |
| 2006/0023757 | A1 * | 2/2006 | Mooradian | H01S 5/18305 | 372/18 |
| 2006/0268241 | A1 * | 11/2006 | Watson | G03B 21/204 | 348/E9.027 |
| 2006/0280219 | A1 * | 12/2006 | Shchegrov | G03B 21/204 | 372/99 |
| 2007/0153862 | A1 * | 7/2007 | Shchegrov | H01S 5/141 | 348/E9.026 |
| 2007/0153866 | A1 * | 7/2007 | Shchegrov | H04N 9/315 | 372/99 |
| 2008/0159344 | A1 * | 7/2008 | Penn | H01S 5/18305 | 372/23 |
| 2008/0174738 | A1 * | 7/2008 | Takeda | H04N 9/3129 | 348/E9.026 |
| 2008/0192259 | A1 * | 8/2008 | Sumiyama | G03H 1/28 | 372/92 |
| 2008/0192779 | A1 | 8/2008 | Ikuta | | |
| 2008/0205459 | A1 * | 8/2008 | Yonekubo | H01S 5/024 | 372/66 |
| 2008/0247427 | A1 * | 10/2008 | Bloom | H01S 5/141 | 372/99 |
| 2008/0291951 | A1 * | 11/2008 | Konttinen | H04N 9/3164 | 372/21 |
| 2009/0003390 | A1 * | 1/2009 | Hoving | H04N 9/3129 | 372/4 |
| 2009/0207873 | A1 * | 8/2009 | Jansen | H01S 5/18305 | 372/50.12 |
| 2009/0279575 | A1 * | 11/2009 | van Grunsven | H01S 5/141 | 372/50.12 |
| 2010/0142570 | A1 * | 6/2010 | Konttinen | H01S 5/185 | 372/21 |
| 2010/0238958 | A1 * | 9/2010 | Creeden | H01S 3/2316 | 372/22 |
| 2010/0238966 | A1 * | 9/2010 | Mochizuki | H01S 5/1835 | 372/99 |
| 2010/0265975 | A1 * | 10/2010 | Baier | H01S 5/423 | 372/29.014 |
| 2011/0148328 | A1 * | 6/2011 | Joseph | F21K 9/00 | 315/312 |
| 2013/0208741 | A1 * | 8/2013 | Vanleeuwen | H01S 5/14 | 372/22 |
| 2013/0266032 | A1 * | 10/2013 | Van Leeuwen | H01S 3/109 | 372/22 |
| 2013/0314766 | A1 * | 11/2013 | Vallius | G02B 5/1861 | 359/326 |
| 2014/0341241 | A1 * | 11/2014 | Essaian | H01S 5/4093 | 372/34 |
| 2015/0124231 | A1 * | 5/2015 | Mulder | G03F 7/704 | 385/2 |
| 2016/0020576 | A1 * | 1/2016 | Watanabe | H01S 5/02325 | 359/328 |
| 2016/0099544 | A1 * | 4/2016 | Hoshino | H01S 5/183 | 372/99 |
| 2019/0386452 | A1 * | 12/2019 | Brick | H01S 5/0092 | |
| 2020/0244044 | A1 * | 7/2020 | Ramer | H01S 5/0092 | |
| 2022/0416510 | A1 | 12/2022 | Arakida | | |
| 2023/0163565 | A1 * | 5/2023 | Halbritter | H01S 5/42 | 372/43.01 |

FOREIGN PATENT DOCUMENTS

| | | | | | |
|---|---|---|---|---|---|
| JP | 2008177473 | A | * | 7/2008 | |
| JP | 2020530666 | A | | 10/2020 | |
| KR | 20080112419 | A | * | 12/2008 | H01S 5/183 |
| WO | WO-2006105249 | A2 | * | 10/2006 | G03B 21/14 |
| WO | WO-2014030361 | A1 | * | 2/2014 | H01S 5/1032 |
| WO | 2018181202 | A1 | | 10/2018 | |
| WO | 2019033120 | A1 | | 2/2019 | |
| WO | WO-2022232076 | A1 | * | 11/2022 | H01S 5/0092 |
| WO | WO-2022264954 | A1 | * | 12/2022 | H01S 5/423 |
| WO | WO-2023158635 | A1 | * | 8/2023 | G02F 1/3775 |

* cited by examiner

SEMICONDUCTOR LASER ASSEMBLY WITH THIN FILM LITHIUM COMPOUND WAVEGUIDE

TECHNICAL FIELD

The present application relates generally to laser assemblies and, more specifically, to semiconductor laser assemblies.

BACKGROUND

Visible light lasers emitting light in the red, green, and blue spectrum (RGB) are broadly used in medical applications such as tissue penetration for diagnosis and treatment. They are also used for projection in screens and displays (including AR/VR displays). Additionally, RGB lasers are used for application that require white light, such as headlights. As a result, compact RGB laser sources that are manufacturable in high volumes, such as VCSELs, are highly sought after for RGB applications.

Currently, most of the available compact RGB solutions are based on LED sources. One drawback to current solutions based on LED sources includes the lack of a wide color-gamut for projectors/displays. Another drawback includes poor beam quality that is detrimental for many of the medical application. Further, LEDs typically have a much wider divergence angle than lasers and have no coherence as opposed to lasers. Both features result in severe losses when delivering the light energy to the tissue. Another downside to using LEDs is their low modulation bandwidth, which is needed for applications requiring short pulse widths.

Current available RGB laser technologies have significantly larger sizes than VCSELs. Gallium nitride-based RGB VCSELs reported in literature have not been proven to be sufficiently reliable and have low efficiencies.

Accordingly, those skilled in the art continue research and development in the field of semiconductor laser assemblies.

BRIEF SUMMARY

Disclosed are semiconductor laser assemblies.

In one example, the semiconductor laser assembly includes an array of surface emitting lasers having a light-emitting surface and an opposing surface; at least one electrical contact electrically coupled to the array of surface emitting lasers to provide the array of surface emitting lasers with an electrical bias from an external electrical source; and an optical waveguide over the light-emitting surface, wherein the optical waveguide comprises lithium. The at least one electrical contact may include: a contact over the light-emitting surface and another contact over the opposing surface, or a pair of contacts over the opposing surface.

The optical waveguide may include lithium niobate or lithium tantalate. The optical waveguide may be periodically poled 180°.

The array of surface emitting lasers may include a plurality of vertical cavity surface emitting lasers or a plurality of photonic crystal surface emitting lasers. The array of surface emitting lasers may include a top emitting laser or a bottom emitting laser. The array of surface emitting lasers may include one or more of the following: an emitter configured to emit electromagnetic radiation or light at a wavelength between 1850 nm and 1950 nm; an emitter configured to emit electromagnetic radiation or light at a wavelength between 1200 nm and 1300 nm; an emitter configured to emit electromagnetic radiation or light at a wavelength between 1000 nm and 1100 nm; an emitter configured to emit electromagnetic radiation or light at a wavelength between 900 nm and 1000 nm; and an emitter configured to emit electromagnetic radiation or light at a wavelength between 1500 nm and 1600 nm.

The array of surface emitting lasers may include at least one emitter having a polarization aligned with a width of the optical waveguide and/or at least one emitter having a polarization perpendicular to a width of the optical waveguide.

The semiconductor laser assembly may include a semi-insulating substrate positioned between the surface emitting laser and the optical waveguide. The semi-insulating substrate may be made of gallium arsenide (GaAs). The semiconductor laser assembly may include an optical beam combiner positioned between the array of surface emitting lasers and the optical waveguide. The semiconductor laser assembly may include an anti-reflective coating over the optical waveguide.

Also disclosed are methods for emitting electromagnetic radiation or light.

In one example, the method includes coupling an optical waveguide comprising lithium with a semiconductor laser and emitting electromagnetic radiation or light at a first wavelength from the semiconductor laser to the optical waveguide, wherein the electromagnetic radiation or light is emitted from the optical waveguide at a second wavelength, and wherein the second wavelength is shorter than the first wavelength.

The coupling may include bonding or regrowth. In an example, the emitting may include emitting electromagnetic radiation or light at a wavelength between 1200 nm and 1300 nm from the semiconductor laser to the optical waveguide whereupon the frequency is doubled or substantially doubled upon passing through the optical waveguide. In another example, the emitting may include emitting electromagnetic radiation or light at a first wavelength from a first emitter to an optical beam combiner, emitting electromagnetic radiation or light at a second wavelength from a second emitter to the optical beam combiner, and emitting from the beam combiner the electromagnetic radiation or light at the first and second wavelengths to the optical waveguide which sums the first and second wavelengths upon passing through the optical waveguide.

Other examples will become apparent from the following detailed description, the accompanying drawings, and the appended claims.

BRIEF DESCRIPTION OF THE DRAWINGS

The disclosure will be described with reference to the following drawing figures wherein like reference numbers identify like parts throughout.

DETAILED DESCRIPTION

Figure 1:
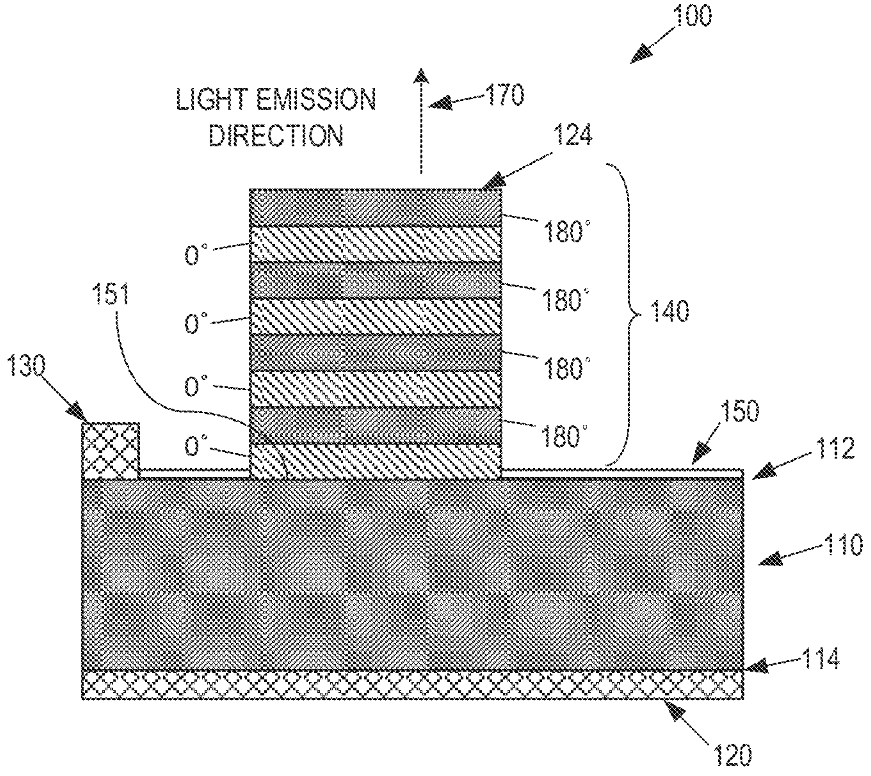
FIG. 1 is a cross-sectional schematic view of an upward or top emitting semiconductor laser assembly.

As used herein, spatial or directional terms, such as “left,” “right,” “inner,” “outer,” “above,” “below,” and the like, relate to the disclosure as it is shown in the drawing figures. However, it is to be understood that the disclosure can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term “approximately” or “about.” Accordingly, unless indicated to the contrary, the numerical values set forth in the following specification and claims may vary depending upon the desired properties sought to be obtained by the present disclosure. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of “1 to 10” should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. “A” or “an” refers to one or more.

As used herein, “coupled,” “coupling,” and similar terms refer to two or more elements that are joined, linked, fastened, connected, put in communication, or otherwise associated (e.g., mechanically, electrically, fluidly, optically, electromagnetically) with one another. In various examples, the elements may be associated directly or indirectly. As an example, element A may be directly associated with element B. As another example, element A may be indirectly associated with element B, for example, via another element C. It will be understood that not all associations among the various disclosed elements are necessarily represented. Accordingly, couplings other than those depicted in the figures may also exist.

As used herein, the phrase “at least one of,” when used with a list of items, means different combinations of one or more of the listed items may be used and only one of each item in the list may be needed. For example, “at least one of item A, item B, and item C” may include, without limitation, item A or item A and item B. This example also may include item A, item B, and item C, or item B and item C. In other examples, “at least one of” may be, for example, without limitation, two of item A, one of item B, and ten of item C; four of item B and seven of item C; and other suitable combinations.

In one aspect, disclosed herein is a semiconductor laser assembly. The semiconductor laser assembly 100 may be used to emit light in the visible light spectrum, such as red, green, and/or blue (RGB) light. The disclosed semiconductor laser assembly may include visible light lasers (red, green, and blue) for use in various applications such as in medical applications for tissue penetration for diagnosis and treatment. The disclosed may also be used for projection in screens and displays (including AR/VR displays). Additionally, the disclosed may be used for applications that require white light, such as headlights. The disclosed semiconductor laser assembly is advantageous in that it can be manufactured to be compact and is manufacturable in high volumes.

Various non-limiting examples will now be described with reference to the accompanying figures where like reference numbers correspond to like or functionally equivalent elements.

The present disclosure includes using vertical cavity surface emitting lasers (VCSEL) or photonic crystal surface emitting lasers (PCSEL) technology, for example, GaAs based, for high reliability and efficiency. In one example, the present disclosure utilizes an integrated RGB light source solution including a polarization-locked VCSEL and a thin film lithium niobate ($LiNbO_3$) optical waveguide 140. The $LiNbO_3$ is poled by applying very high bias on temporarily placed electrodes attached on the sides of the optical waveguide 140. The periodicity of the poling may be such that the crystal structure is inverted when the number of generated photons at a given point in the crystal is at a maximum. After poling is finalized, the periodically poled thin film $LiNbO_3$ is transferred and vertically bonded on top of a VCSEL structure for a top emitting device and on the bottom of a VCSEL structure for a bottom emitting device (see FIGS. 1-3). While an optical waveguide 140 comprising $LiNbO_3$ is described herein, the present disclosure is also applicable to an optical waveguide 140 comprising lithium tantalate ($LiTaO_3$) in replacement of the optical waveguide 140 comprising $LiNbO_3$.

Figure 4:
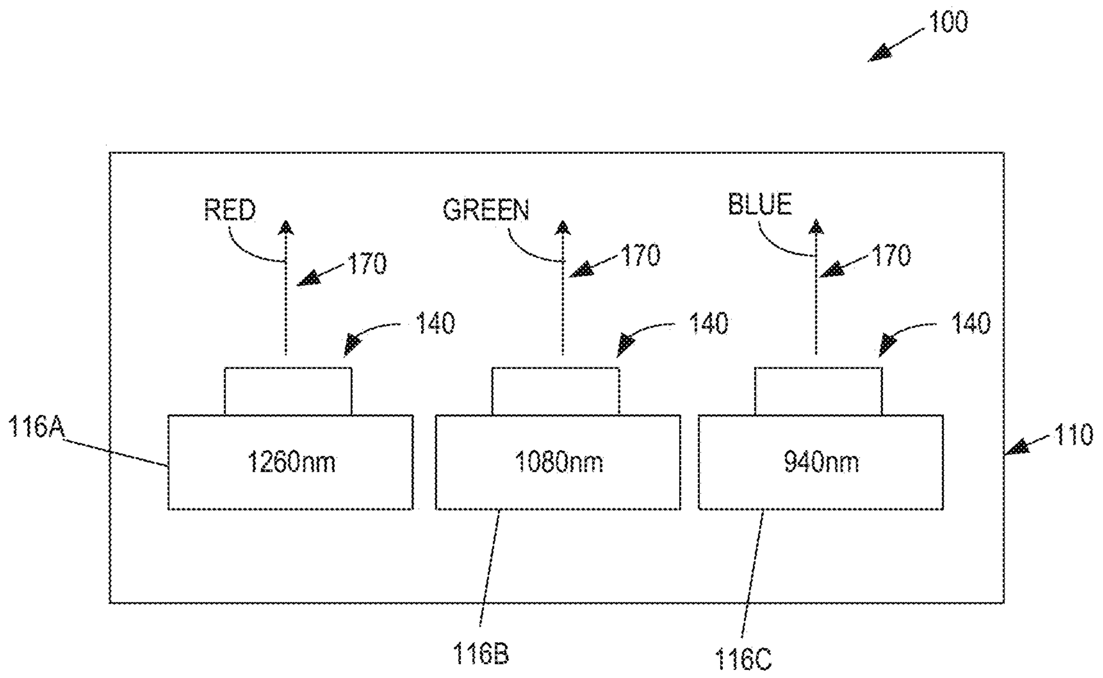
FIG. 4 is a cross-sectional schematic view of a portion of a semiconductor laser assembly.

The present disclosure uses a non-linear optical property of $LiNbO_3$ to convert VCSEL frequency to the visible spectrum. In one non-limiting example (FIG. 4), second harmonic generation can be used for frequency doubling of a 940 nm VCSEL to achieve blue color lasing, frequency doubling of a 1080 nm VCSEL to achieve green color lasing, and frequency doubling of a 1260 nm VCSEL to achieve red color lasing. In another example, red color lasing can be obtained by employing a frequency summing generation property of $LiNbO_3$ and using photons from 1060 nm and 1560 nm VCSEL sources (see FIG. 5) or from 940 nm and 1900 nm VCSEL sources (see FIG. 6). For these configurations, based on the frequency summing generation, 3 or 4 laser sources may be used, depending on the exact optics implementation. The configuration of the lasers (singlet/arrays) may be selected based upon the power requirements of the intended application. Different colors subsystems may be combined within the present disclosure in a full RGB solution using pick and place tools.

To provide a maximum efficiency of frequency conversion, VCSEL light may be polarized in the direction of the $LiNbO_3$ thickness. This may be achieved by implementing a polarization grating on top or within the cavity of the VCSEL structure.

Through co-design of the VCSEL structure with the $LiNbO_3$ thin film (i.e., phase, field matching optimization, beam shaping/focusing), high-power conversion efficiency, as well as high beam quality of the VCSEL can be maintained in the disclosed assembly.

Referring to FIG. 1, in one non-limiting example, a top emitting semiconductor laser assembly 100 includes an array of surface emitting lasers 110 having a light-emitting surface 112 and an opposing surface 114. The array of surface emitting lasers 110 may include any type of lasers required for the intended application. In one example, the array of surface emitting lasers 110 comprises a plurality of VCELs. In another example, the array of surface emitting lasers 110 comprises a plurality of PCSELs.

The top emitting semiconductor laser assembly 100 shown in FIG. 1 includes a first, or bottom side, contact layer 120 on or over the opposing surface 114 and a second, or top side, contact layer 130 on or over the light-emitting surface 112. The first and second contact layers 120 and 130 may be configured, in a manner known in the art, to enable an electrical bias to be applied to emitters 116 (shown in FIGS. 4-7) of the array of surface emitting lasers 110 from an external electrical source to cause the array of surface emitting lasers 110 to output or emit laser light 170, also in a manner known in the art, in an upward direction. Each of the first and second contact layers 120 and 130 may be of any suitable and/or desirable thickness for a desired current density for the application and may be comprised of any suitable and/or desirable electrically conductive material or compound, such as, for example, without limitation: gold-germanium (AuGe) for an n-type contact or titanium-platinum-gold (TiPtAu) for a p-type contact.

Figure 2:
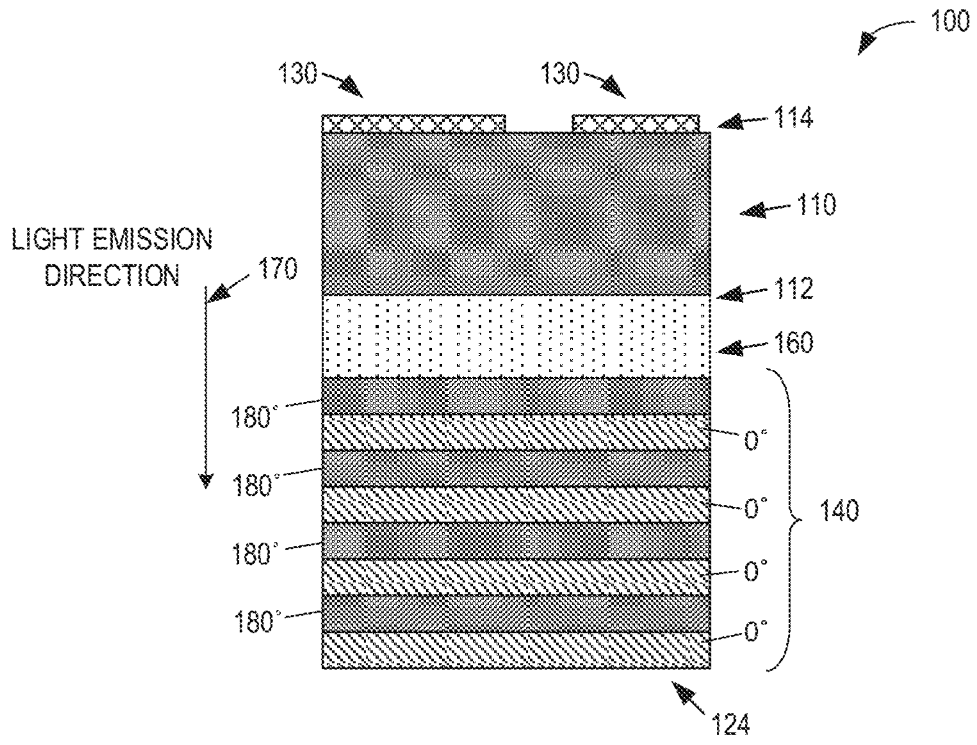
FIG. 2 is a cross-sectional schematic view of a downward or bottom emitting semiconductor laser assembly.
Figure 3:
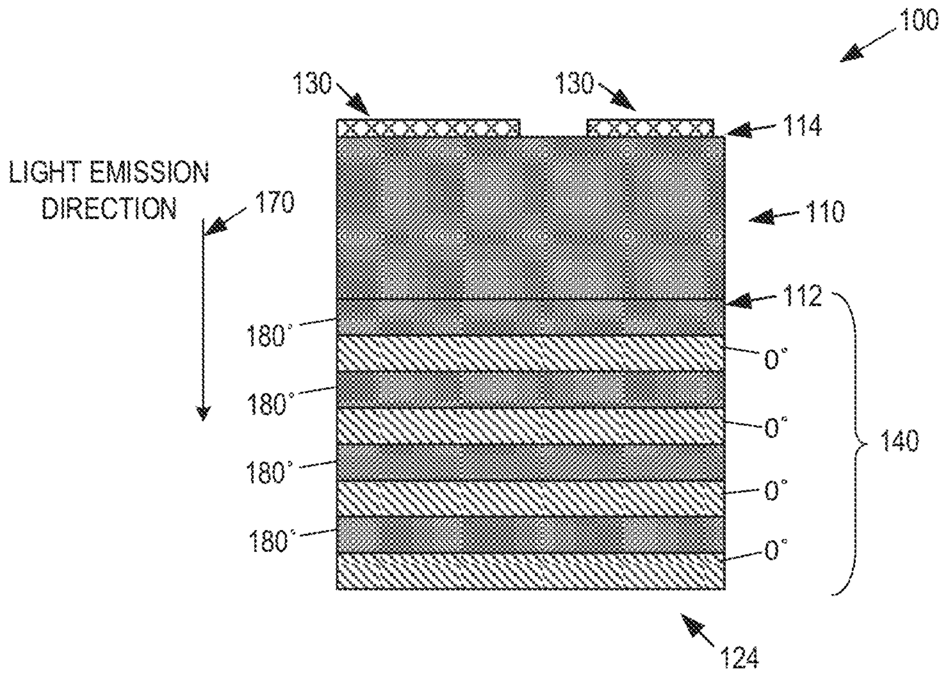
FIG. 3 is a cross-sectional schematic view a downward or bottom emitting semiconductor laser assembly.

Referring to FIGS. 2 and 3, the example bottom emitting semiconductor laser assemblies 100 shown in FIGS. 2 and 3 may include a pair of spaced second, or top side, contact layers 130 on or over the opposing surface 114, which, in these figures, is the top surface of the bottom emitting semiconductor laser assemblies 100. The bottom emitting semiconductor laser assemblies 100 shown in FIGS. 2 and 3 do not include the first contact layer 120, like the one shown in FIG. 1, on their bottom surfaces to avoid interference by such contact layer with the emission of laser light 170 via the bottom surfaces in a manner known in the art.

The pair of second, or top side, contact layers 130 on the opposing, or top, surfaces 114 of bottom emitting semiconductor laser assemblies 100 shown in FIGS. 2 and 3 may be configured, in a manner known in the art, to enable an electrical bias to be applied to the emitters 116 (shown in FIGS. 4-7) of the array of surface emitting lasers 110 in FIGS. 2 and 3 from an external electrical source to cause the array of surface emitting lasers 110 to output or emit laser light 170, also in a manner known in the art, in an downward direction. Each contact layer 130 in in FIGS. 2 and 3 may be of any suitable and/or desirable thickness for a desired current density for the application and may be comprised of any suitable and/or desirable electrically conductive material or compound, such as, for example, without limitation: gold-germanium (AuGe) for an n-type contact or titanium-platinum-gold (TiPtAu) for a p-type contact.

As shown in FIGS. 1-7, the semiconductor laser assembly 100 further includes an optical waveguide 140 coupled to a light emission direction side of the light-emitting surface 112. In one example, the optical waveguide 140 comprises lithium. In one non-limiting example, the optical waveguide 140 comprises lithium niobate, which offers desirable non-linear optical properties that enables frequency doubling. It is understood that other materials or compounds having comparable non-linear optical properties to those of lithium niobate may be implemented. For example, the optical waveguide may include lithium tantalate or other lithium or non-lithium materials or compounds having comparable optical properties. In one example, the optical waveguide 140 is a thin film lithium niobate waveguide.

As shown in FIGS. 1-3, the optical waveguide 140 of the semiconductor laser assembly 100 may be periodically poled a plurality of times. In one example, the optical waveguide 140 may be periodically poled at or about 180°. In the example shown in FIGS. 1-3, the optical waveguide 140 may be periodically poled at poling angles of 0° and 180° (or 180° and) 0° eight times or periods. However, this is not to be construed in a limiting sense since the number of times or periods the optical waveguide 140 may be periodically poled and the poling angles may be selected by one skilled in the art for a particular application. Using a periodically poled lithium niobate thin film optical waveguide 140 offers an efficient medium for nonlinear wavelength conversion processes, such as for frequency doubling. The semiconductor laser assembly 100 may include a coating 124, such as an anti-reflective coating, on a surface of the optical waveguide 140 opposite the array of surface emitting lasers 110.

Referring to FIGS. 4-7, the array of surface emitting lasers 110 of the semiconductor laser assembly 100 may include a plurality of emitters 116 configured to emit electromagnetic radiation or light at various wavelengths. In some non-limiting examples, the array of surface emitting lasers 110 may comprise at least one emitter 116A configured to emit electromagnetic radiation or light at a wavelength between 1200 nm and 1300 nm. In another example, the array of surface emitting lasers 110 may comprise at least one emitter 116B configured to emit electromagnetic radiation or light at a wavelength between 1000 nm and 1100 nm. In another example, the array of surface emitting lasers 110 may comprise at least one emitter 116C configured to emit electromagnetic radiation or light at a wavelength between 900 nm and 1000 nm. In another example, the array of surface emitting lasers 110 may comprise at least one emitter 116D configured to emit electromagnetic radiation or light at a wavelength between 1000 nm and 1100 nm. In another example, the array of surface emitting lasers 110 may comprise at least one emitter 116E configured to emit electromagnetic radiation or light at a wavelength between 1500 nm and 1600 nm. In yet another example, the array of surface emitting lasers 110 may comprise at least one emitter 116F configured to emit electromagnetic radiation or light at a wavelength between 1850 nm and 1950 nm.

Figure 7:
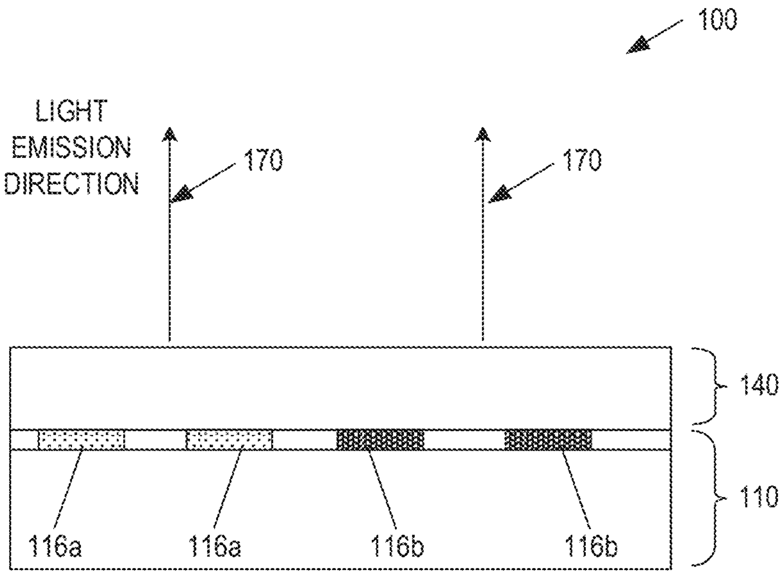
FIG. 7 is a cross-sectional schematic view of a portion of a semiconductor laser assembly.

Referring to FIG. 7, the disclosed semiconductor laser assembly 100 may include a plurality of emitters 116 having different polarizations. In the example of FIG. 7, the array of surface emitting lasers 110 comprises four emitters 116. Some emitters **116*b* in the array may have polarization aligned with the width of the thin film optical waveguide 140. Light from these emitters will result in the doubled frequency at the output of the thin film optical waveguide 140. Other emitters 116*a* in the array may have polarization aligned perpendicular to the width of the thin film optical waveguide 140. Light from emitters 116*a* will not be affected by the non-linear effect in the thin film optical waveguide 140 and the output wavelength will remain the same as at the input wavelength (for example IR). Polarization locking for the emitter can be defined by the photonic crystal design for a PCSEL arrangement or by the grating orientation for VCSEL arrangement. Accordingly, as shown in the example of FIG. 7, the array of surface emitting lasers 110 may include at least one emitter 116*a* having a polarization aligned with a width of the optical waveguide 140 and/or at least one emitter 116*b* having a polarization perpendicular to a width of the optical waveguide 140**.

Referring back to FIG. 1, in an example, the semiconductor laser assembly 100 may include one or more of dielectric layers 150 and 151. In an example, the dielectric layer 151 may be positioned between the array of surface emitting lasers 110 and the optical waveguide 140. In an example, the dielectric layer 151 may comprise an index matching dielectric. In an example, the index matching dielectric comprising dielectric layer 151 may have an index of refraction which is the square of an index n1 of the array of surface emitting lasers 110 times an index n2 of the optical waveguide 140, i.e., (n1×n2) 2. The dielectric layer 150 on the remainder of light-emitting surface 112 surrounding the optical waveguide 140 may be a passivation layer, such as silicon nitride, which can avoid moisture and/or other undesirable contaminates from contacting the remainder of light-emitting surface 112.

Referring to FIG. 2, in an example, the semiconductor laser assembly 100 may include a semi-insulating substrate 160 positioned between the surface emitting lasers 110 and the optical waveguide 140. The semi-insulating substrate 160 may include any material having requisite insulating material properties. In one example, the semi-insulating substrate 160 may comprise gallium arsenide (GaAs).

Figure 5:
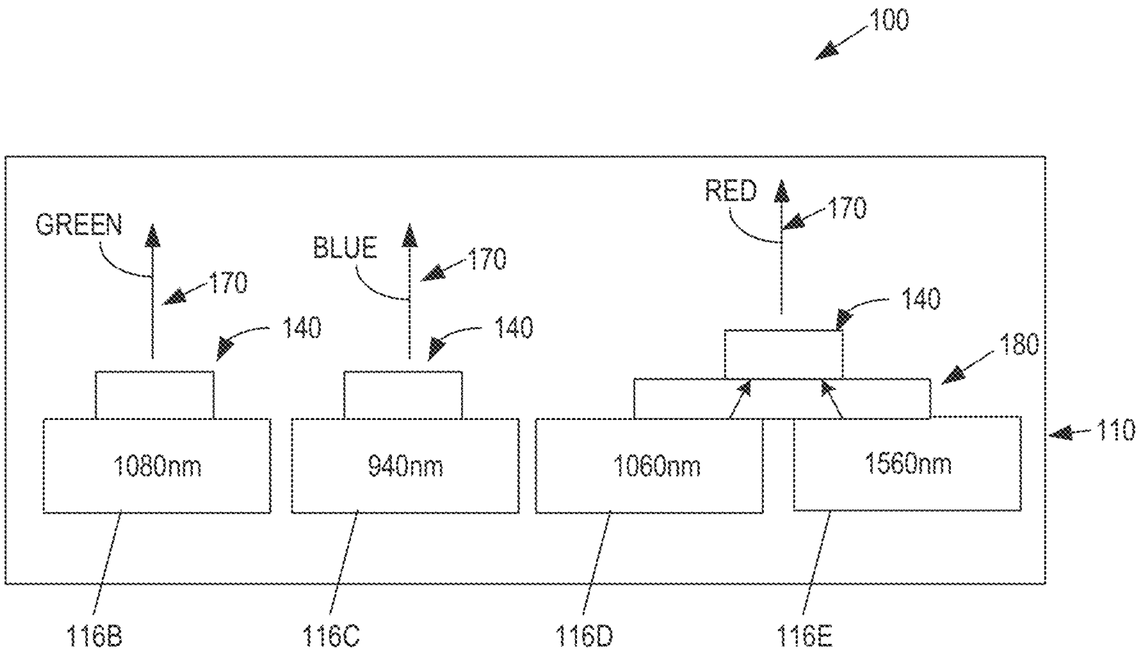
FIG. 5 is a cross-sectional schematic view of a portion of a semiconductor laser assembly.

Referring to FIG. 5, in an example, the semiconductor laser assembly 100 may include an optical beam combiner 180 positioned between the array of surface emitting lasers 110 and the optical waveguide 140. In an example, an optical beam combiner 180 may be positioned between the emitters 116D and 116E in FIG. 5. In an example, the optical beam combiner 180 provides the electromagnetic radiation or light output by emitters 116D and 116E at the wavelengths of, for example, 1060 nm (corresponding to a frequency f1 about 943 KHz) and 1560 nm (corresponding to frequency f2 about 641 kHz), respectively, to the optical waveguide 140 positioned on top of the optical beam combiner 180. In this example, the optical waveguide 140 sums these frequencies f1 and f2 to obtain an output electromagnetic radiation or light having a wavelength of about 630 nm (corresponding to a frequency f3 about 1590 kHz) which corresponds to the color red. In the example semiconductor laser assembly 100 shown in FIG. 5, the emitter 116C is positioned directly beneath an optical waveguide 140 without an intervening optical beam combiner 180 therebetween and the emitter 116B is positioned directly beneath an optical waveguide 140, also without an intervening optical beam combiner 180 therebetween. In this disclosure, because the values of frequencies and wavelengths are rounded to three or four figures, whereupon any figures thereafter are omitted, the value of each frequency and/or wavelength may be referred to, without limitation, as being "about" a certain value. However, this is not to be construed in a limiting sense.

Figure 8:
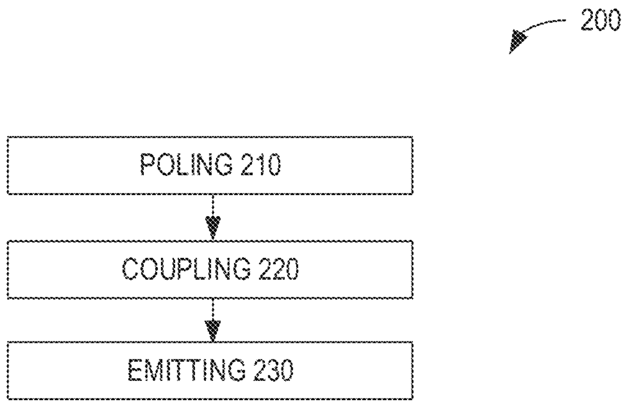
FIG. 8 is a flow diagram of a method for emitting electromagnetic radiation or light.

Referring to FIG. 8, also disclosed is a method 200 for emitting electromagnetic radiation or laser light 170, as shown in FIGS. 4-7. The method 200 may be used with a VCSEL or PCSEL assembly. In one example, the method 200 may include coupling 220 a lithium niobate optical waveguide 140 to an array of surface emitting lasers 110. In one example, the coupling 220 may include bonding optical waveguide 140 to the array of surface emitting lasers 110 either directly, as shown in FIG. 3, or via the semi-insulating substrate 160, as shown in FIG. 2. In another example, the coupling 220 may include regrowth of the optical waveguide 140 to a surface of the array of surface emitting lasers 110.

In one example, the method 200 may include coupling 220 to yield a semiconductor laser assembly 100 having an array of surface emitting lasers 110 having a light-emitting surface 112 and an opposing surface 114. The array of surface emitting lasers 110 may include any type or wavelength of laser required for the intended application. In one example, the array of surface emitting lasers 110 may comprise a plurality of vertical cavity surface emitting lasers (VCELs). In another example, the array of surface emitting lasers 110 may comprise a plurality of photonic crystal surface emitting lasers (PCSELs).

In an example, the semiconductor laser assembly 100 shown in FIG. 1, formed by the method 200, may include a first, or bottom side, contact layer 120 on or over the opposing (bottom) surface 114 and a second, or top side, contact layer 130 on or over a part or portion of the light-emitting surface 112. Each contact layer 120 and 130 may be of any suitable and/or desirable thickness for a desired current density for the application and may be comprised of any suitable and/or desirable electrically conductive material or compound, such as, for example, without limitation: gold-germanium (AuGe) for an n-type contact or titanium-platinum-gold (TiPtAu) for a p-type contact.

In another example, the semiconductor laser assembly 100 shown in FIGS. 2 and 3, formed by the method 200, may include a pair of spaced contact layers 130 on or over parts or portions of the opposing (top) surface 114 and no contact on the bottom surface. Each contact layer 130 may be of any suitable and/or desirable thickness for a desired current density for the application and may be comprised of any suitable and/or desirable electrically conductive material or compound, such as, for example, without limitation: gold-germanium (AuGe) for an n-type contact or titanium-platinum-gold (TiPtAu) for a p-type contact.

As shown in FIGS. 1-7, the semiconductor laser assembly 100 formed by the method 200 may include an optical waveguide 140 on or over an upward facing light-emitting surface 112 (in FIG. 1) or on or below a downward facing light-emitting surface 112 (in FIGS. 2 and 3) to receive electromagnetic radiation or light emitted from the array of surface emitting lasers 110. For example, since FIG. 1 shows a top emitting semiconductor laser assembly 100, the optical waveguide 140 is positioned on top of the light-emitting surface 112 which emits electromagnetic radiation or light upwardly in the figure. In another example, since FIGS. 2 and 3 show bottom emitting semiconductor laser assemblies 100, the optical waveguides 140 are positioned on or below the light-emitting surfaces 112 which emit electromagnetic radiation or light downwardly in the figures. Herein, the terms "electromagnetic radiation," "light," and "laser light" may be used interchangeably when referring to the emission of electromagnetic radiation, light, or laser light from any surface emitting laser or the array of surface emitting lasers 110.

In an example, the optical waveguide 140 comprises lithium. In one non-limiting example, the optical waveguide 140 may comprise lithium niobate, which offers desirable non-linear optical properties that enables frequency doubling of a single wavelength electromagnetic radiation or light (of frequency f1) propagating through the optical waveguide 140 or, when the optical waveguide 140 is used with the optical beam combiner 180, that provides to the optical waveguide 140 two different wavelengths of electromagnetic radiation or light (of frequencies f1 and f2), the optical waveguide 140 emits electromagnetic radiation or light at a frequency of f3 which is the sum of frequencies f1 and f2, i.e., f3=f1+f2. It is understood that other materials having comparable non-linear optical properties to those of lithium niobate may be implemented. For example, the optical waveguide 140 may include lithium tantalate or other lithium or non-lithium materials having comparable optical properties. In one example, the optical waveguide 140 is a thin film lithium niobate waveguide.

As shown in FIGS. 1-3, the optical waveguide 140 of the semiconductor laser assembly 100 formed by the method 200 may be periodically poled. In one example, the optical waveguide 140 is periodically poled at about 180°. Using a periodically poled lithium niobate thin film optical waveguide 140 offers an efficient medium for nonlinear wavelength conversion processes, such as for frequency doubling the frequency of a single wavelength electromagnetic radiation or light input into the optical waveguide 140 or summing the frequencies of at least two wavelengths of electromagnetic radiation or light input into the optical waveguide 140, e.g., from an optical beam combiner 110. The semiconductor laser assembly 100 may include a coating 124, such as an anti-reflective coating, on a surface of the optical waveguide 140 opposite the array of surface emitting lasers 110.

Referring to FIGS. 4-7, the semiconductor laser assembly 100 formed by the method 200 may include an array of surface emitting lasers 110 including a plurality of emitters 116 configured to emit electromagnetic radiation or light at various wavelengths. In one example, the array of surface emitting lasers 110 may comprise at least one emitter 116A configured to emit electromagnetic radiation or light at a wavelength between 1200 nm and 1300 nm. In another example, the array of surface emitting lasers 110 may comprise at least one emitter 116B configured to emit electromagnetic radiation or light at a wavelength between 1000 nm and 1100 nm. In another example, the array of surface emitting lasers 110 may comprise at least one emitter 116C configured to emit electromagnetic radiation or light at a wavelength between 900 nm and 1000 nm. In another example, the array of surface emitting lasers 110 may comprise at least one emitter 116D configured to emit electromagnetic radiation or light at a wavelength between 1000 nm and 1100 nm. In another example, the array of surface emitting lasers 110 may comprise at least one emitter 116E configured to emit electromagnetic radiation or light at a wavelength between 1500 nm and 1600. In yet another example, the array of surface emitting lasers 110 may comprise at least one emitter 116F configured to emit electromagnetic radiation or light at a wavelength between 1850 nm and 1950 nm.

The array of surface emitting lasers 110 in FIGS. 4-7 are shown emitting electromagnetic radiation or laser light 170 in an upward direction, e.g., when used with the semiconductor laser assembly 100 shown in FIG. 1. However, it is to be understood that the array of surface emitting lasers 110 in any one of FIGS. 4-7 may be inverted (i.e., with the thin film optical waveguides 140 below the emitters 116) whereupon said array of surface emitting lasers 110 emit electromagnetic radiation or laser light 170 in a downward direction, e.g., when used with the semiconductor laser assemblies 100 shown in FIGS. 2 and 3.

Referring to FIG. 7, the disclosed semiconductor laser assembly 100 formed by the method 200 may include a plurality of emitters 116 having different polarizations. In the example of FIG. 7, the array of surface emitting lasers 110 may comprise four emitters 116. Some emitters **116*b* in the array may have polarization aligned with the width, in FIG. 7, of the thin film optical waveguide 140. Light from these emitters 116*b* will result in a doubled frequency at the output of the thin film optical waveguide 140. Other emitters 116*a* in the array may have polarization perpendicular to the width of the thin film optical waveguide 140. Light from these emitters 116*a* will not be affected by the non-linear effect of the thin film optical waveguide 140 and the wavelength will remain the same as at the input wavelength (for example IR). Polarization locking for each emitter can be defined by the photonic crystal design for a PCSEL arrangement or by the grating orientation for VCSEL arrangement. Accordingly, as shown in the example of FIG. 7, the array of surface emitting lasers 110 may include at least one emitter 116*a* having a polarization aligned with a width of the optical waveguide 140 and/or at least one emitter 116*b* having a polarization perpendicular to a width of the optical waveguide 140**.

Referring to FIG. 2, in one or more examples, the semiconductor laser assembly 100 formed by the method 200 may include a semi-insulating substrate 160 positioned between the surface emitting laser 110 and the optical waveguide 140. The semi-insulating substrate 160 may include any material having requisite insulating material properties. In one example, the semi-insulating substrate 160 may comprise gallium arsenide (GaAs).

Figure 6:
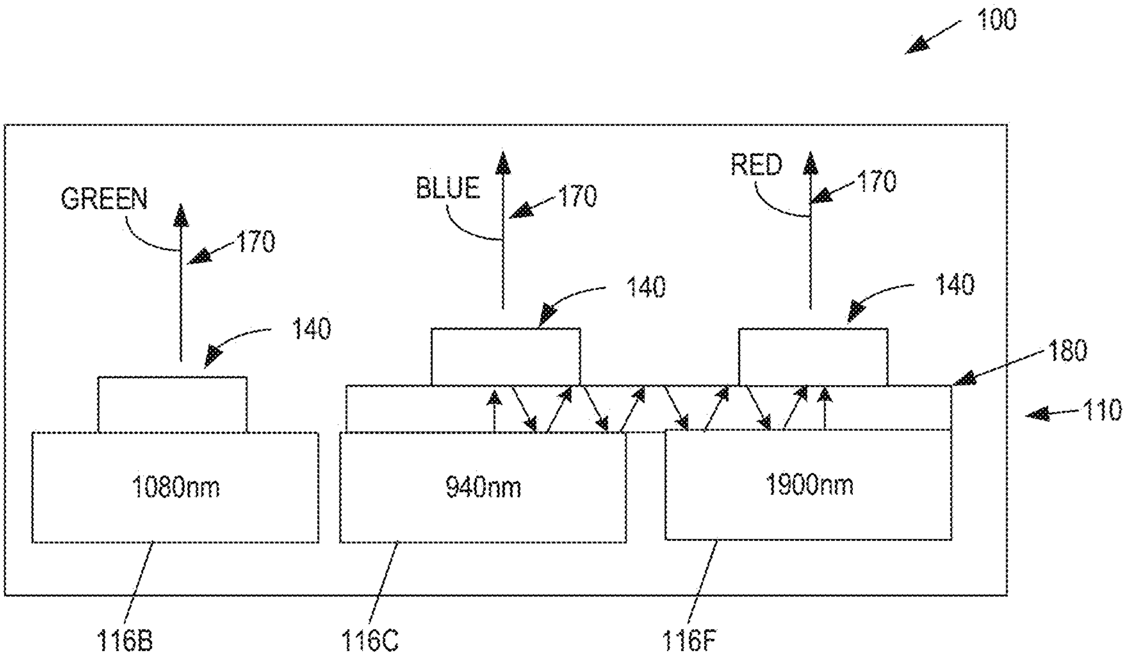
FIG. 6 is a cross-sectional schematic view of a portion of a semiconductor laser assembly.

Referring to FIGS. 5 and 6, in one or more examples, the semiconductor laser assembly 100 formed by the method 200 may include an optical beam combiner 180 positioned between two or more emitters 116 of array of surface emitting lasers 110 and a single optical waveguide 140. The optical beam combiner 180 of FIG. 6 may pass electromagnetic radiation or light (of frequency f1) output by emitter 116C directly to the optical waveguide 140 positioned on top or above of the emitter 116C. In the manner described above, the optical waveguide 140 positioned on top or above of the emitter 116C doubles the frequency of the electromagnetic radiation or light output by the emitter 116C directly to said optical waveguide 140. Additionally, the optical beam combiner 180 of FIG. 6 may pass or direct electromagnetic radiation or light (of frequency f1) output by emitter 116C to the optical waveguide 140 positioned on top or above of the emitter 116F. The optical waveguide 140 positioned on top or above of the emitter 116F also receives electromagnetic radiation or light (of frequency f2) output by emitter 116F. In the manner described above, the optical waveguide 140 positioned on top or above of the emitter 116F, sums the frequencies (f1 and f2) of the electromagnetic radiation or light received by said optical waveguide 140 from emitters 116C and 116F and outputs or emits electromagnetic radiation or laser light 170 at a frequency f3 which is the sum of frequencies f1 and f2, i.e., $f3=f1+f2$.

Referring back to FIG. 8, the method 200 may include emitting 230 electromagnetic radiation or light at a first wavelength from the semiconductor laser assembly 100 to the optical waveguide 140. The electromagnetic radiation or light at the first wavelength is then subsequently emitted from the optical waveguide 140 at a second wavelength. In one example, the second wavelength may be shorter than the first wavelength. For example, the output frequency of the second wavelength may be doubled such that the output wavelength is about half that of the input wavelength. In one example, the second wavelength is about half the first wavelength.

The emitting 230 of the method 200 may include emitting electromagnetic radiation or light in the RGB visible light spectrum. Accordingly, in one example, the emitting 230 may include emitting electromagnetic radiation or light at a wavelength between 1200 nm and 1300 nm from an emitter 116 of the semiconductor laser assembly 100 to an optical waveguide 140 such that the frequency is substantially doubled upon passing through the optical waveguide 140.

The emitting 230 of the method 200 may further include combining (summing) electromagnetic radiation or light emitted at two or more different average wavelengths to result in a different output wavelength. For example, the emitting 230 may include emitting electromagnetic radiation or light at a first wavelength (corresponding to a first frequency f1), for example a wavelength between 1000 nm and 1100 nm, from a first emitter 116D to an optical beam combiner 180, and concurrently emitting electromagnetic radiation or light at a second wavelength (corresponding to a second frequency f2), for example a wavelength between 1500 nm and 1600 nm, from a second emitter 116E to the optical beam combiner 180. The optical beam combiner 180 routes the electromagnetic radiation or light at the first and second wavelengths (and, hence, the first and second frequencies f1 and f2) to the optical waveguide 140, coupled to the optical beam combiner 180, which outputs or emits electromagnetic radiation or laser light 170 at a frequency f3 which is the sum of frequencies f1 and f2, i.e., f3=f1+f2. In the above-mentioned example, the first and second wavelengths and the first and second frequencies f1 and f2 are different and the frequency f3 and, hence, wavelength of the output electromagnetic radiation or laser light 170 are different from the first and second frequencies f1 and f2 and the first and second wavelengths. It is understood that the above-mentioned examples of wavelengths and frequencies are merely exemplary and that any two or more average wavelengths input into an optical beam combiner 180 may be routed to and summed by the optical waveguide 140 coupled to the optical beam combiner 180.

In one or more examples, the method 200 may include poling 210 a lithium niobate thin film to yield a periodically poled optical waveguide having 180° periodically inverted domains. In one example, the poling 210 comprises coupling a plurality of electrodes to the lithium niobate film and applying suitable electrical bias(es) to the electrodes to yield a periodically poled optical waveguide 140.

Other non-limiting examples or aspects of this disclosure are set forth in the following illustrative and exemplary numbered clauses:

Clause 1. A semiconductor laser assembly comprising: an array of surface emitting lasers having a light-emitting surface and an opposing surface; at least one electrical contact electrically coupled to connected to provide to the array of surface emitting lasers an electrical bias from an external electrical source; and an optical waveguide over the light-emitting surface, wherein the optical waveguide comprises lithium.

Clause 2: The semiconductor laser assembly of clause 1, wherein the at least one electrical contact may include a contact over the light-emitting surface and another contact over the opposing surface, or a pair of contacts over the opposing surface.

Clause 3. The semiconductor laser assembly of clause 1 or 2, wherein the optical waveguide may comprise lithium niobate.

Clause 4. The semiconductor laser assembly of any one of clauses 1-3, wherein the optical waveguide may comprise lithium tantalate.

Clause 5. The semiconductor laser assembly of any one of clauses 1-4, wherein the optical waveguide may be periodically poled 180°.

Clause 6. The semiconductor laser assembly of any one of clauses 1-5, wherein the array of surface emitting lasers may comprise a plurality of vertical cavity surface emitting lasers or a plurality of photonic crystal surface emitting lasers.

Clause 7. The semiconductor laser assembly of any one of clauses 1-6, wherein the array of surface emitting lasers comprises top emitting lasers or bottom emitting lasers.

Clause 8. The semiconductor laser assembly of any one of clauses 1-7, wherein the array of surface emitting lasers comprises at least one emitter configured to emit electromagnetic radiation at a wavelength between 1850 nm and 1950 nm.

Clause 9. The semiconductor laser assembly of any one of clauses 1-8, wherein the array of surface emitting lasers comprises at least one emitter configured to emit electromagnetic radiation at a wavelength between 1200 nm and 1300 nm.

Clause 10. The semiconductor laser assembly of any one of clauses 1-9, wherein the array of surface emitting lasers comprises at least one emitter configured to emit electromagnetic radiation at a wavelength between 1000 nm and 1100 nm.

Clause 11. The semiconductor laser assembly of any one of clauses 1-10, wherein the array of surface emitting lasers comprises at least one emitter configured to emit electromagnetic radiation at a wavelength between 900 nm and 1000 nm.

Clause 12. The semiconductor laser assembly of any one of clauses 1-11, wherein the array of surface emitting lasers comprises at least one emitter configured to emit electromagnetic radiation at a wavelength between 1500 nm and 1600 nm.

Clause 13. The semiconductor laser assembly of any one of clauses 1-12, wherein the array of surface emitting lasers comprises at least one emitter having a polarization aligned with a width of the optical waveguide.

Clause 14. The semiconductor laser assembly of any one of clauses 1-13, wherein the array of surface emitting lasers comprises at least one emitter having a polarization perpendicular to a width of the optical waveguide.

Clause 15. The semiconductor laser assembly of any one of clauses 1-14, further comprising a semi-insulating substrate positioned between the surface emitting laser and the optical waveguide.

Clause 16. The semiconductor laser assembly of any one of clauses 1-15, wherein the semi-insulating substrate comprises gallium arsenide (GaAs).

Clause 17. The semiconductor laser assembly of any one of clauses 1-16, further comprising an optical beam combiner positioned between the array of surface emitting lasers and the optical waveguide.

Clause 18. The semiconductor laser assembly of any one of clauses 1-17, further comprising an anti-reflective coating over the optical waveguide.

Clause 19. A method for emitting electromagnetic radiation, the method comprising: coupling an optical waveguide comprising lithium with a semiconductor laser; and emitting electromagnetic radiation at a first wavelength from the semiconductor laser to the optical waveguide, wherein the electromagnetic radiation is emitted from the optical waveguide at a second wavelength, and wherein the second wavelength is shorter than the first wavelength.

Clause 20. The method of clause 19, wherein the second wavelength is about half the first wavelength.

Clause 21. The method of clause 19 or 20, wherein the coupling comprises bonding or regrowth.

Clause 22. The method of any one of clauses 19-21, wherein the emitting comprises emitting electromagnetic radiation at a wavelength between 1200 nm and 1300 nm from the semiconductor laser to the optical waveguide whereupon the frequency is doubled or substantially doubled upon passing through the optical waveguide.

Clause 23. The method of any one of clauses 19-22, wherein the emitting comprises: emitting electromagnetic radiation at the first wavelength from a first emitter of the semiconductor laser to an optical beam combiner; emitting electromagnetic radiation at a second wavelength from a second emitter of the semiconductor laser to the optical beam combiner; and emitting from the optical beam combiner the electromagnetic radiation at the first and second wavelengths to the optical waveguide which sums first and second frequencies associated with the first and second wavelengths upon passing through the optical waveguide.

Clause 24. The method of any one of clauses 19-23, wherein: the first wavelength is between 900 nm and 1000 nm; and the second wavelength is between one of: (1) 900 nm and 1000 nm, or (2) 1850 nm and 1950 nm.

Clause 25. The method of any one of clauses 19-24, further comprising poling a lithium niobate or lithium tantalate thin film to yield a periodically poled optical waveguide having 180° periodically inverted domains.

Although various examples of the disclosed semiconductor laser assembly have been shown and described, modifications may occur to those skilled in the art upon reading the specification. The present application includes such modifications and is limited only by the scope of the claims.

What is claimed is:

1. A semiconductor laser assembly comprising:

an array of surface emitting lasers having a light-emitting surface and an opposing surface;

at least one electrical contact electrically connected to provide to the array of surface emitting lasers an electrical bias from an external electrical source;

multiple optical waveguides over the light-emitting surface, wherein the optical waveguides comprise lithium, and the optical waveguides are periodically poled; and an optical beam combiner positioned on the light-emitting surface to combine electromagnetic radiation emitted by a pair of first surface emitting lasers of the array, wherein the optical waveguides comprise a first optical waveguide positioned on the optical beam combiner to generate a sum-frequency of the electromagnetic radiation emitted by the pair of first surface emitting lasers of the array and at least one second optical waveguide positioned on the light-emitting surface to frequency-double electromagnetic radiation emitted by at least one second surface emitting lasers of the array.

2. The semiconductor laser assembly of claim 1, wherein the at least one electrical contact includes:

a contact over the light-emitting surface and another contact over the opposing surface, or a pair of contacts over the opposing surface.

3. The semiconductor laser assembly of claim 1, wherein the optical waveguide comprises lithium niobate.

4. The semiconductor laser assembly of claim 1, wherein the optical waveguide comprises lithium tantalate.

5. The semiconductor laser assembly of claim 1, wherein the array of surface emitting lasers comprises a plurality of vertical cavity surface emitting lasers or a plurality of photonic crystal surface emitting lasers.

6. The semiconductor laser assembly of claim 1, wherein the array of surface emitting lasers comprises top emitting lasers or bottom emitting lasers.

7. The semiconductor laser assembly of claim 1, wherein the pair of first surface emitting lasers comprises at least one emitter configured to emit electromagnetic radiation at a wavelength between 1850 nm and 1950 nm.

8. The semiconductor laser assembly of claim 1, wherein the pair of second surface emitting lasers comprises at least one emitter configured to emit electromagnetic radiation at a wavelength between 900 nm and 1000 nm.

9. The semiconductor laser assembly of claim 1, wherein at least one of (a) the pair of first surface emitting lasers and (b) the second surface emitting lasers comprises at least one emitter configured to emit electromagnetic radiation at a wavelength between 1000 nm and 1100 nm.

10. The semiconductor laser assembly of claim 1, wherein the second surface emitting lasers comprise at least one emitter configured to emit electromagnetic radiation at a wavelength between 900 nm and 1000 nm.

11. The semiconductor laser assembly of claim 1, wherein the pair of first surface emitting lasers comprises at least one emitter configured to emit electromagnetic radiation at a wavelength between 1500 nm and 1600 nm.

12. A semiconductor laser assembly comprising:

an array of surface emitting lasers having a light-emitting surface;

at least one electrical contact electrically connected to provide to the array of surface emitting lasers an electrical bias from an external electrical source; and an optical waveguide disposed over the light-emitting surface and comprising lithium;

wherein the array of surface emitting lasers comprises:

at least one first emitter having a polarization aligned with a width of the optical waveguide such that at least a portion of electromagnetic radiation emitted by the at least one first emitter is frequency-doubled in the optical waveguide, and at least one second emitter having a polarization aligned perpendicular to the width of the optical waveguide such that electromagnetic radiation emitted by the at least one second emitter passes through the optical waveguide with unchanged wavelength.

13. The semiconductor laser assembly of claim 12, wherein the optical waveguide is periodically poled.

14. The semiconductor laser assembly of claim 1, further comprising a semi-insulating substrate positioned between the surface emitting laser and the optical waveguide.

15. The semiconductor laser assembly of claim 14, wherein the semi-insulating substrate comprises gallium arsenide (GaAs).

16. The semiconductor laser assembly of claim 1, further comprising an anti-reflective coating over the optical waveguide.

17. The semiconductor laser assembly of claim 1, further comprising a third optical waveguide positioned on the optical beam combiner to frequency-double a portion of the electromagnetic radiation emitted by one of the first surface emitting lasers.

* * * * *